(12) United States Patent
Lillestolen et al.

(10) Patent No.: US 10,540,213 B2
(45) Date of Patent: Jan. 21, 2020

(54) JTAG LOCKOUT WITH DUAL FUNCTION COMMUNICATION CHANNELS

(71) Applicant: Hamilton Sundstrand Corporation, Charlotte, NC (US)

(72) Inventors: Kirk A. Lillestolen, East Hartland, CT (US); Kanwalpreet Reen, Phoenix, AZ (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 24 days.

(21) Appl. No.: 15/914,121

(22) Filed: Mar. 7, 2018

(65) Prior Publication Data
US 2019/0278633 A1  Sep. 12, 2019

(51) Int. Cl.
*G06F 9/52* (2006.01)
*G01R 31/00* (2006.01)

(52) U.S. Cl.
CPC ........... *G06F 9/526* (2013.01); *G01R 31/008* (2013.01)

(58) Field of Classification Search
CPC ...... G06F 17/50; G06F 17/5027; G06F 17/30; G01R 31/008
See application file for complete search history.

(56) References Cited

U.S. PATENT DOCUMENTS

| | | | |
|---|---|---|---|
| 6,983,441 B2 | 1/2006 | Wescott | |
| 7,313,730 B1 * | 12/2007 | Ryser | G06F 11/2236 714/25 |
| 7,363,564 B2 | 4/2008 | Moss et al. | |
| 7,657,807 B1 | 2/2010 | Watkins et al. | |
| 7,844,997 B2 * | 11/2010 | Tucker | G06F 11/27 726/2 |
| 7,886,150 B2 * | 2/2011 | Stollon | G01R 31/31719 713/169 |
| 8,099,629 B2 * | 1/2012 | Feng | G01R 31/31719 714/27 |
| 8,362,798 B2 | 1/2013 | Fulks, III | |
| 8,397,067 B1 | 3/2013 | Knight | |
| 8,438,436 B1 | 5/2013 | Baker et al. | |
| 8,601,321 B2 | 12/2013 | Feng | |
| 9,262,340 B1 * | 2/2016 | van Antwerpen | G06F 12/14 |

(Continued)

OTHER PUBLICATIONS

Clark, C. J. "Anti-tamper JTAG TAP design enables DRM to JTAG registers and P1687 on-chip instruments", Hardware-Oriented Security and Trust (Host), 2010 IEEE International Symposium, Jun. 13, 2010, pp. 19-24.

(Continued)

*Primary Examiner* — Henry Tsai
*Assistant Examiner* — Christopher Daley
(74) *Attorney, Agent, or Firm* — Cantor Colburn LLP

(57) ABSTRACT

A Joint Test Action Group (JTAG) communication lockout processor is disclosed. The processor is configured to generate a unlock sequence based on an operational mode change of an operably connected programmable device, and save the unlock sequence to one or more memory registers. The processor can also receive an execution of the unlock sequence via a dual function JTAG communication bus, determine, via an unlock logic, whether the execution of the unlock sequence is valid, and responsive to determining that the execution of the unlock sequence is valid, allow or disallow the JTAG communication with an embedded processor.

17 Claims, 3 Drawing Sheets

(56) References Cited

U.S. PATENT DOCUMENTS

| | | | |
|---|---|---|---|
| 9,564,902 B2* | 2/2017 | Synder | H03K 19/177 |
| 2006/0212679 A1* | 9/2006 | Alfano | G06F 1/08 |
| | | | 712/38 |
| 2007/0162759 A1* | 7/2007 | Buskey | G06F 11/3656 |
| | | | 713/182 |
| 2008/0109903 A1* | 5/2008 | Werner | G06F 12/1433 |
| | | | 726/22 |
| 2012/0060067 A1 | 3/2012 | Youm et al. | |
| 2014/0344919 A1* | 11/2014 | Wu | G06F 21/74 |
| | | | 726/17 |
| 2015/0349968 A1 | 12/2015 | Dworak et al. | |
| 2017/0090909 A1* | 3/2017 | Guo | G06F 8/66 |

OTHER PUBLICATIONS

Extended European Search Report for European Application No. 19160997.3; Date of Completion: Aug. 7, 2019; dated Aug. 19, 2019; 8 Pages.

* cited by examiner

JTAG LOCKOUT WITH DUAL FUNCTION COMMUNICATION CHANNELS

BACKGROUND

Exemplary embodiments pertain to the art of programmable device security, and particularly, to Joint Test Action Group (JTAG) lockout for embedded processor programming in a programmable device.

The Institute of Electrical and Electronics Engineers (IEEE) provides industry Standard IEEE1149.1, commonly referred to as JTAG (which stands for Joint Test Action Group) communication. This standard details an industry set of commands that allow the JTAG user to read, modify, upload and download the program loaded into a programmable device. This access is a method for programming devices during production. For example, field programmable gate arrays (FPGAs), complex programmable logic device (CPLDs), memory devices, and many other types of processors can implement JTAG communication. Along with this capability comes the risk of undesired and/or malicious access to the programmable devices. Closed box access provided through JTAG (i.e., connecting to the device without directly accessing the physical programmable device itself) gives direct access to the control logic on the device with the ability to intentionally copy, or maliciously modify the operation of the device. Current JTAG security designs use complex encryption methodologies that require significant configuration control, key management, and complex testing rigs.

BRIEF DESCRIPTION

Disclosed is a JTAG lockout assembly for a programmable device. The lockout assembly includes a programmable device having an embedded processor, and a lockout processor operatively connected to the embedded processor. The lockout processor has an unlock logic configured to allow or disallow a JTAG communication with the programmable device and/or embedded processor based on a unlock sequence operational across a dual function JTAG communication bus. The assembly also includes a test interface as a separate computer operatively connected to the embedded processor via a communication bus, that is removable after configuration of the system. The test interface is configured to retrieve the unlock sequence from one or more memory registers via an unlock controller operating on the test interface, and execute, via the unlock controller, the unlock sequence across the dual function JTAG communication bus. If the execution of the unlock sequence, which was retrieved from one or more predetermined memory registers located either on or off-device respective to the embedded processor, is determined to be valid by the lockout processor, the test interface can then access the programmable device through the JTAG.

A Joint Test Action Group (JTAG) lockout processor is also disclosed. The processor connects a test interface to an embedded processor, receives a unlock sequence, validates the unlock sequence, and allows or disallows JTAG communication to one or more of the programmable device and the embedded processor.

Also disclosed is a method for Joint Test Action Group (JTAG) lockout for a programmable device on an aircraft. The method includes connecting an embedded processor to a programmable device configured to control a portion of the aircraft. The method further includes configuring the lockout processor with an unlock logic configured that can allow or disallow JTAG communication with the via a dual function JTAG communication bus, and connecting a test interface to the programmable device and a lockout processor via a communication bus. The unlock channel is configured to transmit a unlock sequence across the communication bus. The method further includes configuring the lockout processor to allow or disallow the JTAG communication based on the unlock sequence.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures.

Figure 1:
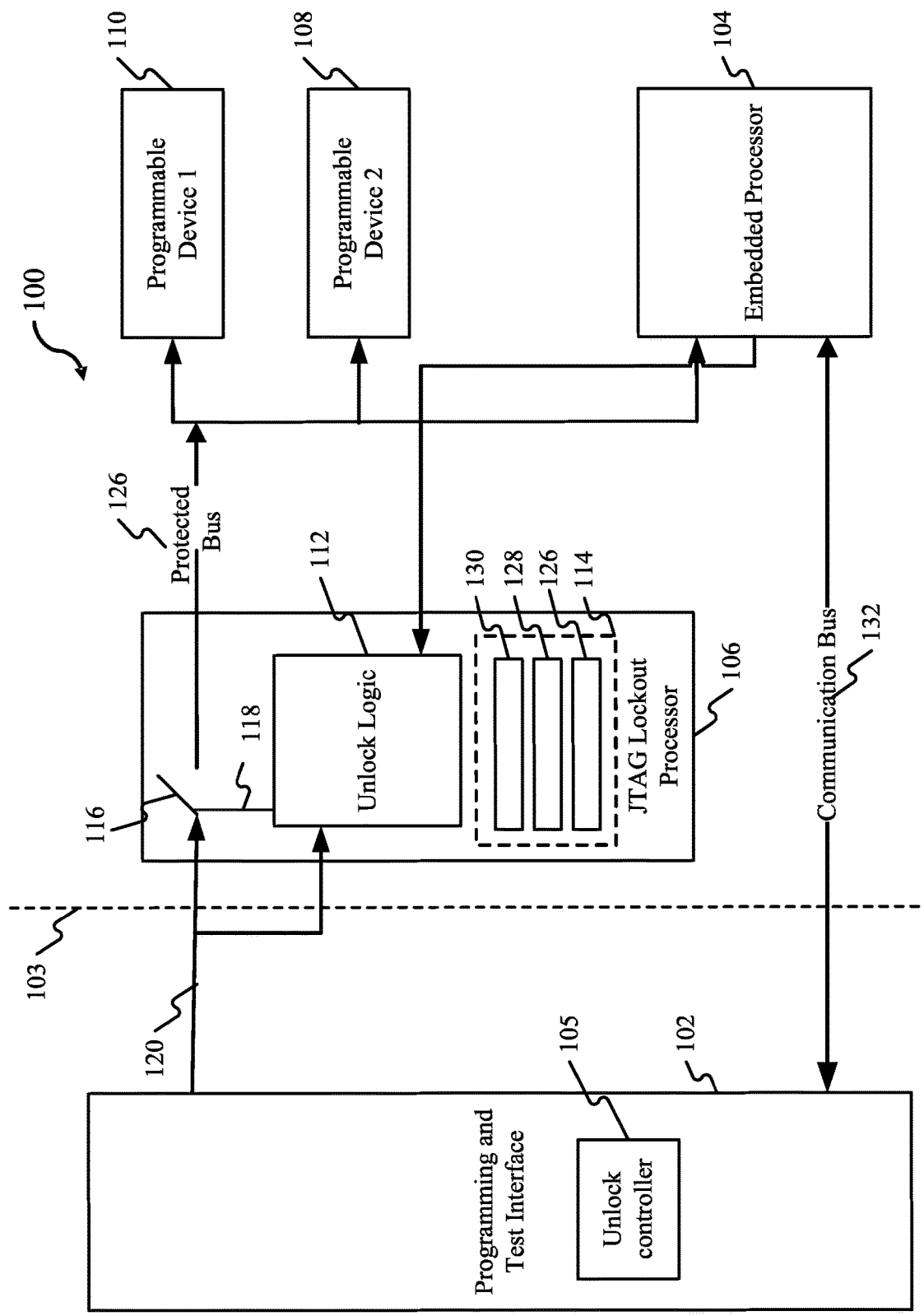
FIG. 1 depicts a system for JTAG lockout of programmable devices according to one embodiment.

Security features that do not rely on encryption for programming embedded processors or programmable devices may be advantageous when providing closed box access to the devices. FIG. 1 depicts a JTAG lockout assembly 100 for locking out JTAG communication with embedded processors and/or programmable devices, according to one embodiment. Although not shown, system 100 is implemented on one or more systems on an aircraft, and provides JTAG security for programming the embedded processor without reliance on encryption that necessitates additional hardware and complexity in design.

Referring now to FIG. 1, system 100 includes a programming and test interface 102 (hereafter "test interface 102" or "interface 102"), an embedded processor 104, a JTAG lockout processor 106, and programmable devices 108 and 110. Programmable devices 108 and 110 are devices connected to embedded processor 104 that are also isolated from test interface 102.

Test interface 102 connects with embedded processor 104 via a communication bus 132 to retrieve all of the various portions of an unlock sequence that, when correctly executed, provide JTAG access to embedded processor 104. Once allowed programming access to embedded processor 104 or programmable devices 108 or 110 (by virtue of entry of a correct sequence) test interface 102 is permitted by JTAG lockout processor 106 to proceed JTAG communication with embedded processor 104 for programming operations via JTAG communication line 120. The provided access allows for JTAG programming operations of embedded processor 104 (and any embedded processors and/or programmable devices connected devices) by test interface 102.

Programmable device 108 and programmable device 110 are operatively connected with embedded processor 104 via the same JTAG bus. Protected bus 126 is protected by being isolated from programming and test interface 102 by JTAG lockout processor. Embedded processor 104 is connected to programming and test interface 102 via lockout processor 106. After correct entry (execution) of the unlock sequence via the dual function JTAG communication bus 120, programming and test interface 102 may program any one or more of embedded processor 104, programmable device 1 (shown as block 108) and programmable device 2 (shown as block 110). Although only three embedded processors are shown (that is, embedded processor 104, and imbedded processors that are integrated with programmable device 108 and programmable device 110) it is appreciated that modern aircraft may have many programmable devices operatively connected together in various ways in one or more systems.

Test interface 102 may be a computer, tablet, handheld device, or other processor operative for connecting to embedded devices and performing programming and/or testing steps with JTAG. Test interface 102 includes an unlock controller 105 configured to perform one or more operations described herein. In order to provide the capability for closed box access through JTAG, test interface 102 includes one or more features described herein that can protect against malicious access to critical systems to prevent updates, reconfiguration, or download of proprietary information and logic stored on embedded processor 104, programmable device 108, and/or programmable device 110.

Lockout processor 106 includes a gate 116, and unlock logic 112 that can control access to protected bus 126 (and thus embedded processor 104 and subsequently connected devices 108 and 110) via gate 116. Gate 116 may be any electronically operated gate, switch, etc., configured to allow and disallow data traffic to pass based on a control signal from a processor executing control logic (e.g., unlock logic 112). Examples of electronically operated gates include, for example, a MOSFET or other semiconductor or analog device. Unlock logic 112 is configured to control gate 116 via gate bus 118.

Memory 114 may be any operatively connected computer memory including, for example, a plurality of memory addresses in embedded processor 104 or in lockout processor 106 (if lockout processor 106 is configured as an independent controller). Memory 114 may also be configured in lockout processor 106, devices 108 or 110, or any other operatively connected computing module (not shown) that is separate from test interface 102 (shown as separate from test interface 102 by a device box 103). Memory 114 can include a plurality of memory registers 126, 128, 130 . . . etc. Although the physical location(s) of memory 114 can vary, the locations of memory registers 126-130 are known by embedded processor 104 and unlock logic 112, and thus, are predetermined. Knowledge of the specific locations of the memory registers 126-130 is protected by and known only to unlock controller 105.

Many electronic units used in aerospace include processing systems or programmable logic with closed box JTAG access. Modern aircraft include multiple embedded processing systems such as, for example, programmable gate arrays (FPGAs), complex programmable logic device (CPLDs), memory devices, and many processors. Programmable devices generally use JTAG communication for programming, which is always implemented via a communication bus directly connected to the programmable device. In one embodiment, one or more low cost and robust JTAG lockout features are provided that have low overhead costs for configuration and maintenance. Instead of configuring system 100 with encryption that secures embedded processor 104 from unwanted access, system 100 instead implements a multi bit programmable lockout feature.

Referring still to FIG. 1, embedded processor 104 can be, for example, an aircraft system or sub-system (or portion thereof) for flight control, communication, etc., and may be encased in a housing (e.g., closed box) that provides access to the programmable device through a serial communication port configured to connect via a communication bus 132, and JTAG communication line 120.

Lockout processor 106 includes an unlock logic 112 configured to allow or disallow a JTAG communication with the embedded processor 104 using JTAG communication channel 120 based on a unlock sequence. The unlock sequence is operational across the JTAG communication bus 120 as it functions as an unlock channel as one function of its dual functionality. For example, in one embodiment, system 100 transmits an unlock sequence across the JTAG communication bus 120 (as shown in FIG. 1).

Most programmable devices include a normal operation mode and a separate programming mode for programming the embedded processor. According to one embodiment, JTAG lockout processor 106 provides accessibility to embedded processor 104 only when in programming mode. In one embodiment, the operational mode is changed by test interface 102 via communication bus 132 by causing a triggering event such as a device restart (power cycle), actuation of a mode switch (e.g., changing from operation mode to programming mode) or in some other way. Accordingly, test interface 102 can cause embedded processor 104 to change an operational mode.

Embedded processor 104 is configured to generate a unique lockout sequence at each change in the operational mode of the programmable device or any pre-defined event. For example, after each system restart, embedded processor 104 generates a unique lockout sequence, which over-writes the previously saved lockout sequence stored in predetermined static memory location(s). In one embodiment, the lockout sequence changes based on a predefined event (like power up, read of a register, a power cycle, etc.). The sequence is different for every new JTAG access. As previously explained, the static memory locations are known only to embedded processor 104 and JTAG lockout processor 106.

The unlock sequence includes a sequence portion indicative of one or more pulse sequences that are sequential with respect to a computer clock time. The pulse sequences are configured to pulse across the JTAG communication bus 120. The pulse sequences may change at each triggering of a mode change, and are uniquely determined by JTAG lockout processor 106 at each triggering of the mode change.

According to one embodiment, unlock logic 112 is configured to save the unlock sequence to one or more of a plurality of predetermined memory register locations 114. In one aspect, each of the predetermined memory register locations 114 can be configured to include a predetermined portion of the unlock sequence. For example, the predetermined portion can include only one of the sequence portion and the channel portion. In another aspect, a single memory register location may contain an entire unlock sequence. The location(s) are predetermined and known only to lockout processor 106. This feature provides a layer of security without encryption of the data.

According to one embodiment, when in normal operation mode, test interface 102 queries lockout processor 106 via communication bus 132 for the unlock sequence from a specific, known, private address such as, for example, address register 130. After retrieving the unlock sequence, unlock controller 105 may transmit (execute) the retrieved sequences over the JTAG communication bus 120.

An exemplary unlock sequence includes two portions: the unlock sequence may be a series of pulses with respect to time. For example, the unlock sequence may be four sequential pulses, followed by two cycles of no pulses, then a single pulse on the JTAG communication bus 120. According to this example, after unlock controller 105 has retrieved the saved unlock sequence portions from embedded processor 104, unlock controller 105 may execute the retrieved sequences across the JTAG communication bus 120. Accordingly, JTAG lockout processor 106 receives, via the JTAG communication bus 120, four sequential pulses, followed by two cycles of no pulses, then a single pulse. Any combination of pulses, channels, and time diminutions are contemplated. According to the present example, the unlock sequence includes the pulses in a particular order, and at a particular rate with respect to computer clock cycle time. The number of pulses and the time portion may be determined based on a random number generator that is triggered at each mode change of embedded processor 104 and/or lockout processor 106. There are many known ways to generate a random number including, for example, a number generation algorithm, a number generator chip, etc. Accordingly, test interface 102 may retrieve, via unlock controller 105, the unlock sequence from one or more memory registers 114, and execute, via lockout processor 106, the unlock sequence. Lockout processor 106 may provide or deny access to programmable device (e.g., embedded processor 104) responsive to test interface 102 executing the unlock sequence across the JTAG communication bus 120.

It is again emphasized that the precise location(s) for storing unlock sequences are known only to embedded processor 104 and test interface 102. Although the specific lockout or access is controlled by the unlock sequence that changes at each mode change (startup for example), the location at which they are stored is not changed.

Figure 2:
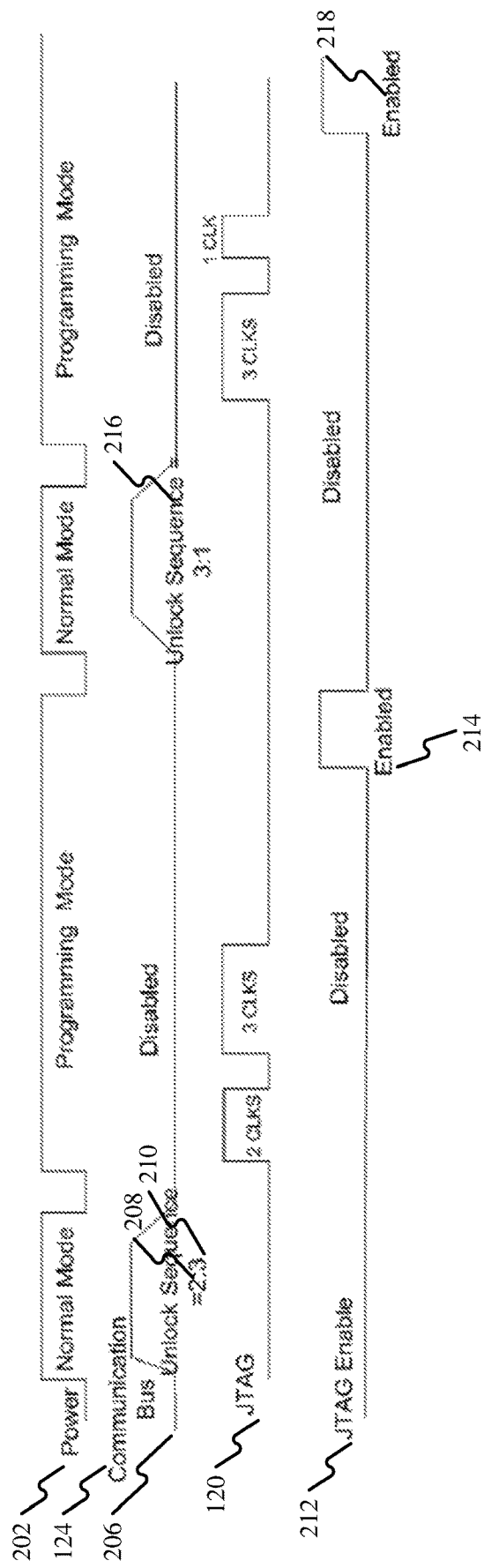
FIG. 2 depicts an exemplary implementation of the system of FIG. 1 according to one embodiment.

FIG. 2 depicts an exemplary implementation of operation of the system of FIG. 1, according to one embodiment. Referring now to FIG. 2, mode trigger 202 depicts a starting low power operational mode that transitions into a normal operational mode. As shown on the subsequent line depicting data transmission on communication bus 132, test interface 102 retrieves an unlock sequence 206. Unlock sequence 206 includes the sequence portion 210 indicative of one or more pulse sequences 208 and 210 that are sequential with respect to a computer clock time (demonstrated generally from left to right in FIG. 2) the number prior to the ":" is the number of clock periods for the first pulse on the JTAG communication bus 120 and the number to the right of ":" is the number of clock periods for the second pulse on the JTAG communication bus 120. Although only two pulse sequences are shown, it is appreciated that three, four, five, or more pulse sequence patterns are contemplated. For example, the unlock sequence 206 could have 3, 4, 5, or more numbers where each number represents the next pulse duration. In another aspect, the pulse pattern could alternate between length of high/low periods, etc. The syntax of unlock sequence 206 is exemplary only, and not intended to be a limiting feature to embodiments described herein.

As shown in the JTAG Enable line 212, once the third pulse is complete on channel 124 (the final portion of unlock sequence 206), unlock logic 112 determines whether the unlock sequence executed by test interface 102 is valid. Determining whether the sequence is valid includes comparing the executed sequence from test interface 102 with the last stored sequences in memory. As demonstrated in FIG. 2, the execution of the unlock sequence was determined to be valid, and thus, JTAG enable line 212 shows a gate closing 214 (e.g., gate 116). The gate closing is effectuated by unlock logic 112 via gate bus 118. JTAG communication is now allowed via JTAG communication line 120. Gate 116 is opened by unlock logic 112 after cessation of JTAG communication, or subsequent to a mode change.

Demonstrating a second generation of a unique unlock sequence, subsequent to another mode change, a unique unlock sequence 216 is generated by JTAG lockout processor 106 having three pulses on the JTAG communication bus 120. After receipt of a valid execution of this sequence, JTAG lockout processor 106 closes gate 116 and access is permitted (enabled 218) to embedded processor 104. Now JTAG programming operations are allowed.

Figure 3:
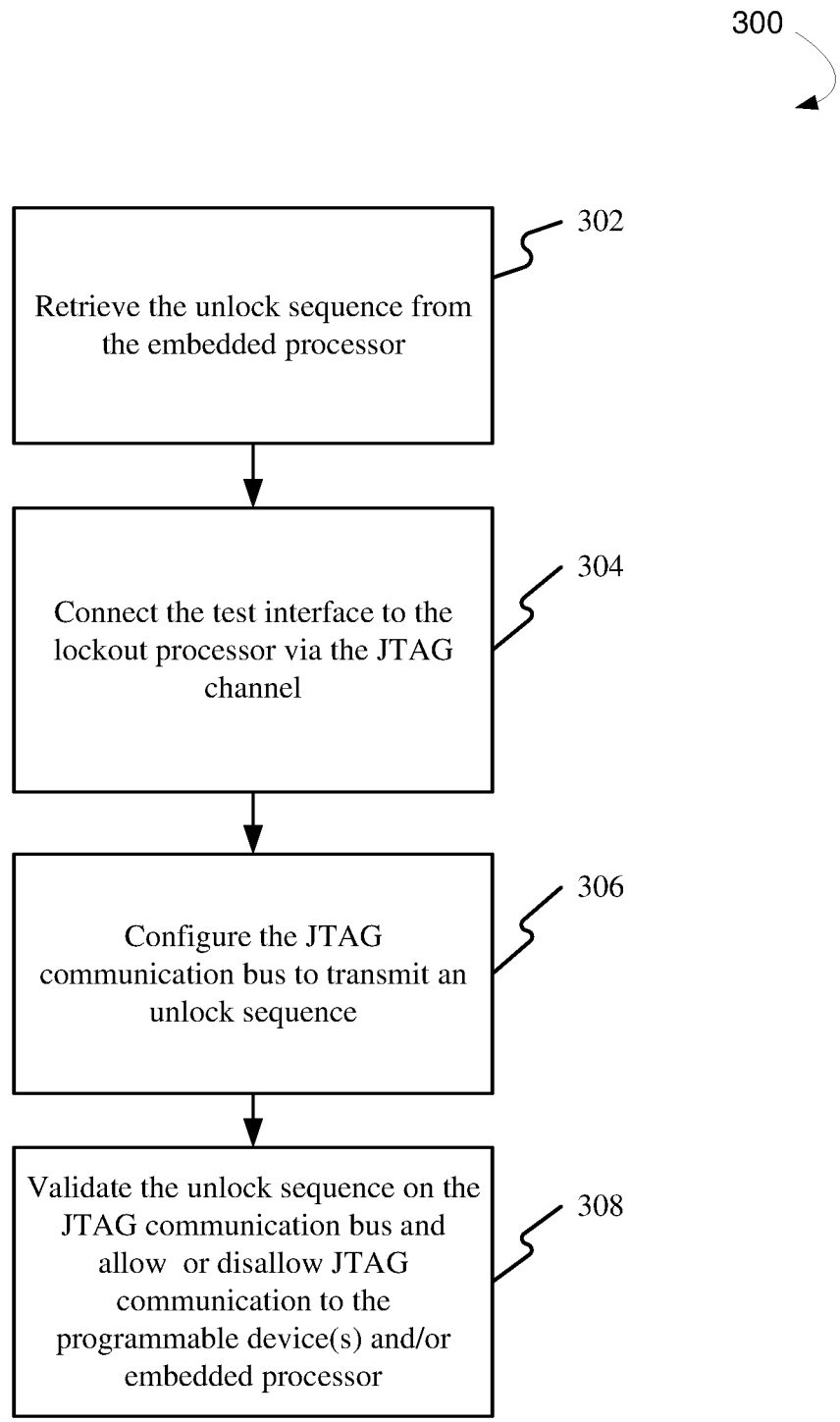
FIG. 3 depicts a method for JTAG lockout using the system of FIG. 1 according to one embodiment.

FIG. 3 depicts a method 300 for JTAG lockout using the system of FIG. 1, according to one embodiment. Referring briefly to FIG. 3, as shown in block 302, programming and test interface 102 retrieves the unlock sequence from embedded processor 104.

As shown in block 304, the next step includes connecting the test interface to lockout processor 104 via the JTAG communication bus 120.

In step 306, we next configure the dual function JTAG communication bus 120 for transmission of the retrieved unlock sequence.

The concluding step 308 includes validating the unlock sequence on the dual function JTAG communication bus 120, and allowing or disallowing JTAG communication to the programmable device(s) and/or embedded processor 104.

Embodiments of the present invention provide a low cost, and flexible protection mechanism for JTAG protection. Most electronic units that require the use of JTAG have an existing processing element, and communication bus which can be used as is. One additional standard, low cost, configurable component is required to implement the lockout functionality. Embodiments do not rely on complicated encryption/decryption capabilities or complicated test rig capabilities.

The term "about" is intended to include the degree of error associated with measurement of the particular quantity based upon the equipment available at the time of filing the application. For example, "about" can include a range of ±8% or 5%, or 2% of a given value.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A Joint Test Action Group (JTAG) lockout assembly for a programmable device comprising:
   an embedded processor in the programmable device;
   a lockout processor operatively connected to the embedded processor, wherein the lockout processor comprises an unlock logic configured to allow or disallow JTAG communication with the embedded processor based on an unlock sequence operational across a dual function JTAG communication bus; and
   a test interface operatively connected to the embedded processor and the lockout processor, the test interface configured to cause an unlock controller to:
      retrieve an unlock sequence on the JTAG communication bus from one or more memory registers via a lockout controller operating on the test interface; and
      execute the unlock sequence across the JTAG communication bus; and
      access the programmable device through the JTAG communication bus responsive to executing the unlock sequence,
   wherein the JTAG communication bus is configured for dual functions comprising JTAG communication and unlock communication,
   wherein the unlock sequence is saved to a plurality of predetermined memory register locations, wherein each of the predetermined memory register locations comprises a predetermined portion of the unlock sequence.

2. The JTAG lockout assembly of claim 1, wherein the lockout processor comprises:
   unlock logic configured to:
      validate the unlock sequence based on an operational mode change; and
      a gate operatively connected to the unlock logic and configured to connect the JTAG communication bus with the programmable device when the test interface has executed a valid unlock sequence.

3. The JTAG lockout assembly of claim 2, wherein the embedded processor is configured to generate a unique lockout sequence at each change in the operational mode of the programmable device.

4. The JTAG lockout assembly of claim 2, wherein the unlock logic is configured to save the unlock sequence to a predetermined memory register location.

5. The JTAG lockout assembly of claim 2, wherein the unlock sequence comprises a sequence portion indicative of one or more pulse sequences that are sequential with respect to a computer clock time.

6. The JTAG lockout assembly of claim 1, further comprising a second programmable device operatively connected to the embedded processor and the lockout processor, wherein the lockout processor allows JTAG communication with the second programmable device responsive to the test interface executing the unlock sequence.

7. A Joint Test Action Group (JTAG) lockout processor configured to:
   connect a test interface to an embedded processor;
   receive an unlock sequence on a dual function JTAG communication bus;
   validate the unlock sequence; and
   allow or disallow JTAG communication to one or more of a programmable device and the embedded processor,
   wherein the unlock sequence is saved to a plurality of predetermined memory register locations, wherein each of the predetermined memory register locations comprises a predetermined portion of the unlock sequence.

8. The JTAG lockout processor of claim 7, wherein the JTAG communication bus is configured for dual functions comprising JTAG communication and unlock communication.

9. The JTAG lockout processor of claim 8, wherein the unlock sequence is saved to a plurality of predetermined memory register locations, wherein each of the predetermined memory register locations comprises a predetermined portion of the unlock sequence.

10. The JTAG lockout processor of claim 8, further comprising a second programmable device operatively connected to the embedded processor and the lockout processor, wherein the lockout processor allows JTAG communication with the second programmable device responsive to the test interface executing the unlock sequence.

11. The JTAG lockout processor of claim 7, wherein the lockout processor comprises:
    unlock logic configured to:
       validate the unlock sequence based on an operational mode change; and
       a gate operatively connected to the unlock logic and configured to connect the JTAG communication bus with the programmable device when the test interface has executed a valid unlock sequence.

12. The JTAG lockout processor of claim 11, wherein the embedded processor is configured to generate a unique lockout sequence at each change in the operational mode of the programmable device.

13. The JTAG lockout processor of claim 11, wherein the unlock logic is configured to save the unlock sequence to a predetermined memory register location.

14. The JTAG lockout processor of claim 11, wherein the unlock sequence comprises a sequence portion indicative of one or more pulse sequences that are sequential with respect to a computer clock time.

15. A method for Joint Test Action Group (JTAG) lockout for a programmable device on an aircraft comprising:
    connecting a lockout processor to an embedded processor in a programmable device configured to control a portion of the aircraft;
    configuring the lockout processor with an unlock logic to allow or disallow JTAG communication with a JTAG communication bus;
    connecting a test interface to the programmable device and the lockout processor via the JTAG communication bus; and
    connecting the unlock logic to a plurality of memory registers and configuring the unlock logic to save an unlock sequence to a predetermined memory register location at each change in the operational mode of the programmable device,
    wherein the unlock sequence is saved to a plurality of predetermined memory register locations, wherein each of the predetermined memory register locations comprises a predetermined portion of the unlock sequence.

16. The method of claim 15, further comprising:
    configuring the embedded processor to create a unique unlock sequence responsive to a change in an operational mode of the programmable device; and
    configuring the test interface with a lockout controller for:
       retrieving the unlock sequence from one or more memory registers;

executing the unlock sequence across the JTAG bus and accessing the programmable device responsive to a valid execution the unlock sequence.

17. The method of claim 16, further comprising configuring the embedded processor to generate a unique lockout sequence at each change in the operational mode of the programmable device.

* * * * *